United States Patent [19]

Ando et al.

[11] Patent Number: 4,957,061
[45] Date of Patent: Sep. 18, 1990

[54] PLURALITY OF BEAM PRODUCING MEANS DISPOSED IN DIFFERENT LONGITUDINAL AND LATERAL DIRECTIONS FROM EACH OTHER WITH RESPECT TO A SUBSTRATE

[75] Inventors: Kenji Ando, Kawasaki; Osamu Kamiya, Machida; Masao Sugata, Yokohama; Noriko Kurihara, Tokyo; Hiroyuki Sugata, Atsugi; Tohru Den, Tokyo; Toshiaki Kimura, Sagamihara; Takashi Hamamoto, Yokohama; Masahiro Haruta, Tokyo; Kuniji Osabe, Kawasaki, all of Japan

[73] Assignee: Canon Kabushiki Kaisha, Tokyo, Japan

[21] Appl. No.: 453,240

[22] Filed: Dec. 18, 1989

Related U.S. Application Data

[63] Continuation of Ser. No. 937,506, Dec. 3, 1986, abandoned.

[30] Foreign Application Priority Data

Dec. 4, 1985 [JP] Japan .................. 60-271328
Dec. 4, 1985 [JP] Japan .................. 60-271329
Jul. 15, 1986 [JP] Japan .................. 61-164589

[51] Int. Cl.⁵ .................. C23C 16/00
[52] U.S. Cl. .................. 118/719; 118/723; 118/730; 118/308; 118/310; 427/255.7; 427/45.1
[58] Field of Search ........ 118/715, 718, 719, 722, 118/723, 725, 730, 314, 323; 427/34, 423

[56] References Cited

U.S. PATENT DOCUMENTS

| | | | |
|---|---|---|---|
| 2,861,900 | 11/1958 | Smith et al. | 427/423 |
| 3,670,400 | 6/1972 | Singer | 29/527.5 |
| 3,914,573 | 10/1975 | Muehlberger | 219/76 |
| 4,294,194 | 10/1981 | Behn et al. | 118/730 X |
| 4,354,909 | 2/1980 | Takagi et al. | 427/38 X |
| 4,401,054 | 8/1983 | Matsuo et al. | 118/723 |
| 4,403,002 | 9/1983 | Akashi et al. | 118/730 X |
| 4,407,230 | 10/1983 | Barnet | 118/716 |
| 4,434,742 | 3/1984 | Henaff et al. | 118/725 |
| 4,458,626 | 7/1984 | Dessilani | 118/323 |
| 4,504,730 | 3/1985 | Shimizu | 118/725 |
| 4,514,250 | 4/1985 | Hwang | 118/725 |
| 4,566,403 | 1/1986 | Fournier | 118/718 |
| 4,601,260 | 7/1986 | Ovshinsky | 118/718 |
| 4,664,951 | 5/1987 | Doehler | 118/718 X |
| 4,692,233 | 9/1987 | Casey | 118/719 X |

FOREIGN PATENT DOCUMENTS

| | | |
|---|---|---|
| 3014258 | 10/1981 | Fed. Rep. of Germany . |
| 3610298 | 10/1986 | Fed. Rep. of Germany . |
| 3704501 | 9/1987 | Fed. Rep. of Germany . |
| 1349367 | 12/1963 | France . |
| 2558850 | 8/1985 | France . |
| 56-114387 | 8/1981 | Japan . |
| 1359437 | 7/1974 | United Kingdom . |
| 2175708 | 12/1986 | United Kingdom . |

OTHER PUBLICATIONS

Bunshah, et al.; "Deposition Technologies for Films and Coatings"; Copyright 1982 by Noyes Publications; pp. 255–256.

Primary Examiner—Shrive Beck
Assistant Examiner—Alain Bashore
Attorney, Agent, or Firm—Fitzpatrick, Cella, Harper & Scinto

[57] ABSTRACT

A device for blowing fine particles is provided which comprises a plural number of upstream chambers for jetting out fine particles provided against a movable substrate. Each of the upstream chambers may be provided with a gas exciter, and also may be provided with an energy imparter for imparting energy to the substrate.

58 Claims, 6 Drawing Sheets

Fig. 3
(a)
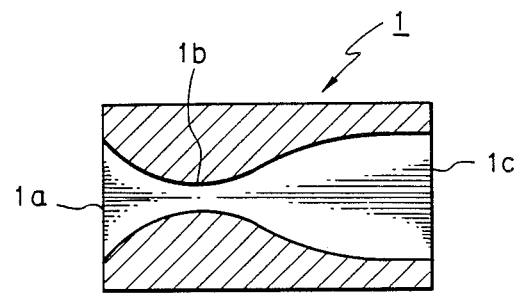
(b)
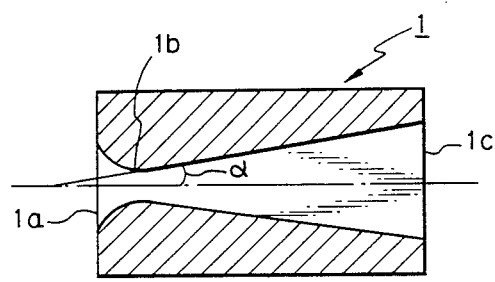
(c)
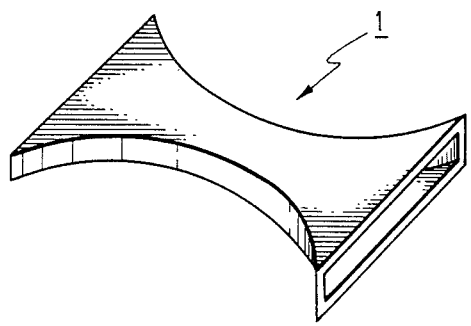

PLURALITY OF BEAM PRODUCING MEANS DISPOSED IN DIFFERENT LONGITUDINAL AND LATERAL DIRECTIONS FROM EACH OTHER WITH RESPECT TO A SUBSTRATE

This application is a continuation of application Ser. No. 937,506 filed Dec. 3, 1986, now abandoned.

BACKGROUND OF THE INVENTION

1. Field of the Invention

This invention relates to a flow control device for blowing fine particles to be utilized, for example, for film forming working, formation of a composite material, doping working with fine particles, or a new field for formation of fine particles.

In the present specification, fine particles refer to atoms, molecules, ultra-fine particles and general fine particles. Ultra-fine particles refer to ultra-fine (generally 0.5 μm or less) particles obtained by an in-gas evaporation method, a plasma evaporation method, a gaseous chemical reaction method, etc, utilizing gas phase reaction, and further the colloidal precipitation method, the solution spraying pyrolysis method, etc., utilizing the liquid phase reaction. General fine particles refer to fine particles obtained by the general method such as mechanical crushing, the precipitating sedimentation treatment, etc. Beam refers to a jet stream flowing in a certain direction with directivity with a higher density than the surrounding space, regardless of its cross-sectional shape.

2. Related Background Art

In the prior art, for example, Japanese Laid-open Patent Publication No. 114387/1981 discloses a device in which the plasma reaction chamber is partitioned into a plural number of chambers so as to carry out film formation of the respective layers in the respective separate chambers as the device for forming heterojunction type amorphous silicon layers.

In that device, a substrate is placed on a conveyer and film formation is carried out by moving said substrate through different kinds of plasma atmospheres.

The device makes it possible to avoid entrainment of impurities into the respective layers, but there is a drawback in that a long time is required for film formation, whereby a laminated film of different materials cannot be formed efficiently.

SUMMARY OF THE INVENTION

An object of the present invention is to provide a device capable of producing a laminated film of different materials efficiently.

It is also another object of the present invention to provide a device capable of forming a film particularly on a substrate of large area with good efficiency.

According to a first embodiment of the present invention, there is provided a device for blowing fine particles, comprising a plural number of upstream chambers for jetting out fine particles provided against a movable substrate.

According to a second embodiment of the present invention, there is provided a device for blowing fine particles, comprising a plural number of upstream chambers each having a gas exciting means and jetting out fine particles activated by said exciting means provided against a movable substrate.

According to a third embodiment of the present invention, there is provided a device for blowing fine particles, comprising a plural number of upstream chambers for jetting out fine particles against a movable substrate, and an energy imparting means for imparting energy to said substrate provided.

According to a fourth embodiment of the present invention, there is provided a device for blowing fine particles, comprising a plural number of upstream chambers each having a gas exciting means and jetting out fine particles activated by said means against a movable substrate, and an energy imparting means for imparting energy to said substrate provided.

According to a fifth embodiment of the present invention, there is provided a device for blowing fine particles, comprising a plural number of upstream chambers for jetting out fine particles against a movable substrate, said upstream chambers being disposed so as to be shifted from each other longitudinally and laterally with respect to the substrate.

According to a sixth embodiment of the present invention, there is provided a device for blowing fine particles, comprising a plural number of upstream chambers each having a gas exciting means and jetting out fine particles activated by said means provided against a movable substrate, said upstream chambers being disposed so as to be shifted from each other longitudinally and laterally with respect to the substrate.

BRIEF DESCRIPTION OF THE DRAWINGS

FIGS. 3(a)–(c) each illustrates an example of the shape of convergent-divergent nozzle.

DETAILED DESCRIPTION OF THE PREFERRED EMBODIMENTS

Figure 1:
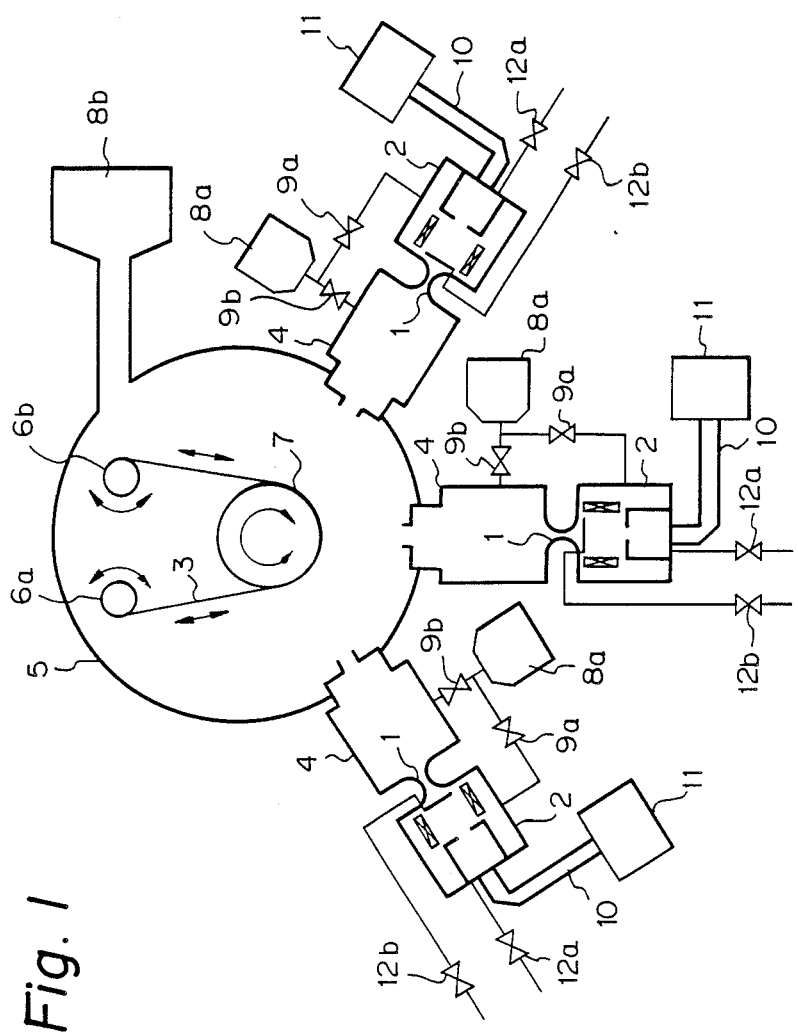
FIG. 1 is a schematic illustration showing an example of the present invention used for a film-forming device.

The nozzle to be used in the present invention may be a general parallel pipe, a convergent nozzle, a convergent-divergent nozzle, etc. Among them, a convergent-divergent nozzle is particularly preferred, because it can produce a supersonic beam of fine particles.

In the following, the present invention by use of a convergent-divergent nozzle is to be described.

The convergent-divergent nozzle 1 can accelerate the flow of the gases jetted out by controlling the pressure ratio $P/P_0$ on the pressure on its downstream side to the pressure $P_0$ on its upstream side and the ratio $A/A^*$ of the cross-sectional area A at the outlet opening 1c to the cross-sectional area $A^*$ at the throat portion 1b. And, if the pressure ratio $P/P_0$ on the upstream side and the downstream side is greater than the critical ratio of pressure, the flow becomes a flow with an outlet flow velocity at the convergent-divergent nozzle 1 of subsonic velocity or lower, whereby the gas is jetted out at a reduced velocity. On the other hand, if the above pressure ratio is lower than the critical ratio of pressure, the outlet velocity at the convergent-divergent nozzle becomes supersonic, whereby the fine particles can be jetted out at supersonic velocity.

The critical ratio of pressure as mentioned in the present invention is a value as defined below.

That is, when the flow velocity coincides with acoustic velocity, the pressure ratio of $P_n$ at the throat portion of the nozzle to the pressure $P_0$ in the upstream chamber is ideally coincident with the value represented by the following formula.

$$R = \left(\frac{2}{\gamma + 1}\right)^{\frac{\gamma}{\gamma+1}}$$

This value of R is called critical ratio of pressure. $\gamma$ is specific heat ratio.

Here, the velocity of the fine particle stream is defined as u, the acoustic velocity at that point as a and the specific heat ratio of the gas stream as $\gamma$, and if the gas stream is assumed to be adiabatically expanded as a compressive one dimensional stream, the reached Mach number M of the gas stream is given by the following formula from the pressure $P_0$ on the upstream side and the pressure P on the downstream side, and M becomes 1 or more, particularly when $P/P_0$ is lower than the critical ratio of pressure.

$$M = \frac{u}{a} = \left(\left[\left(\frac{P_0}{P}\right)^{\frac{\gamma-1}{\gamma}} - 1\right]\frac{2}{\gamma - 1}\right)^{\frac{1}{2}} \quad (1)$$

acoustic velocity a is given by the following formula as a function of the local temperature as T and the gas constant as R.

$$a = \sqrt{\gamma R T}$$

There is the following relationship between the cross-sectional area A at the outflow opening 1c and the cross-sectional area A* at the throat portion 1b and the Mach number M.

$$\frac{A}{A^*} = \frac{1}{M}\left[\frac{2}{\gamma + 1}\left(1 + \frac{\gamma - 1}{2}M^2\right)\right]^{\frac{\gamma+1}{2(\gamma-1)}} \quad (2)$$

Accordingly, by fixing the cross-sectional area ratio $A/A^*$ corresponding to the Mach number M determined from the formula (1) by the pressure ratio $P/P_0$ of the pressure P on the downstream side to the pressure $P_0$ on the upstream side or by controlling $P/P_0$ corresponding to M determined from the formula (2) by $A/A^*$, the gas stream jetted out from the convergent-divergent nozzle can be stably jetted out. The velocity u of the gas stream at this time is given by the following formula (3).

$$u = M\sqrt{\gamma R T}\left(1 + \frac{\gamma - 1}{2}M^2\right)^{-\frac{1}{2}} \quad (3)$$

When the fine particles are jetted out in a certain direction as the supersonic optimally expanded stream as described above, the fine particle stream will proceed straightforward while maintaining substantially the jet stream cross-section immediately after jetted out to form a beam. Accordingly, the flow of the fine particles is also formed into a beam, whereby it will be transported through the space within the downstream side with minimum diffusion under the spatially independent state without interference with the wall surface on the downstream side and at a supersonic velocity.

Thus, since the fine particles are transported as a beam and diffusion during transportation is kept to a minimum, even when different fine particles may be jetted out at the same time from a plural number of convergent-divergent nozzles 1, they will not be mixed with each other.

On the other hand, in the present invention, the substrate 3 is movable and also the convergent-divergent nozzles 1 are positioned along the moving direction of the substrate 3. Thus only by moving the substrate 3 simultaneously with jetting out of different fine particles from the respective convergent-divergent nozzles 1, layers of different kinds of fine particles can be deposited on one another.

As the gas exciting means to be used in the present invention, those of the system employing microwave, laser, an ion gun, an electron gun, etc., may be employed.

As the system employing microwave, in addition to those discharging microwave such as a horn antenna or a slot antenna, there are those by use of a cavity resonator, the electrodeless discharging system such as an electron cyclotron resonance (ECR) system, etc., and also other systems such as a thermoelectron discharging system, bipolar discharging system, magnetic field convergence system (magnetron discharging system), etc.

FIG. 1 is a schematic illustration of an example in which the present invention is utilized for a film-forming device, wherein 1 is a convergent-divergent nozzle, each of 2 is an upstream chamber, 3 is a substrate, 4 are pressure-adjusting chambers and 5 is a downstream chamber.

The downstream chamber 5 is cylindrical in shape, and the three upstream chambers 2 having convergent-divergent nozzles 1 are connected through the respective pressure-adjusting chambers 4 to the circumferential portion of the downstream chamber. The convergent-divergent nozzles 1 are directed toward the substrate 3 in the downstream chambers 5 respectively, which communicate the upstream chambers 2 to the pressure-adjusting chambers 4.

The substrate 3 in the downstream chamber 5 is in a shape of band, and while it is delivered out from one of a set of rotating rollers 6a, 6b, it is taken up onto the other via the supporting roller 7 positioned in front thereof. The above convergent-divergent nozzles 1 are aligned in a row along the moving direction of the substrate 3 which moves between the rotating rollers 6a and 6b, each being directed toward the substrate 3 passing over the supporting roller 7. The supporting roller 7 supports the substrate 3 at its backside against the blowing force of the fine particles by the convergent-divergent nozzles 1.

The upstream chambers 2 and the pressure-adjusting chambers 4 are internally evacuated by pumps 8a through the pressure control valves 9a, 9b, whereby the pressures on the upstream side and the downstream side of the convergent-divergent nozzles 1 can be controlled. The pressure-adjusting chambers 4 are provided for the purpose of controlling the pressures more easily, and it is preferred that they should be communicated through openings as small as possible within the range capable of permitting the jet stream from the convergent-divergent nozzles 1 to pass therethrough. The device can also be simplified by omitting these pressure-adjusting chambers 4 and connecting the convergent-divergent nozzles 1 directly to the downstream chamber 5.

The downstream chamber 5 is designed to be evacuated internally by means of a pump 8b, whereby superfluous gases or reaction products within the downstream chamber 5 can be directly discharged out of the system.

While microwave generating devices 11 are connected through waveguides 10 to the upstream chambers 2, it is also designed that non-film-forming gas and film-forming gas can be fed through feeding valves 12a and 12b. By feeding non-film-forming gas together with introduction of microwave, plasma is generated and the film-forming gas is activated by contacting the film-forming gas with the plasma, followed by jetting out from the convergent-divergent nozzles. Here, the non-film-forming gas refers to a gas which will not itself exhibit film forming ability such as $N_2$, $H_2$, Ar, Ne etc. On the other hand, film-forming gas refers to a gas capable of exhibiting film-forming ability by activation such as methane gas, silane gas, disilane gas, etc.

The activated film-forming gas is jetted out from the convergent-divergent nozzle 1 to be blown against the substrate 3. At this time, as the substrate 3 moves, the different materials jetted out from the three convergent-divergent nozzles 1 will be deposited in three layers. Also, by reciprocating movement of the substrate 3, deposition up to six layers, nine layers, etc., is possible. Deposition of the layers can be alternate deposition of a desired film-forming material layer and its binder layer, or a hetero lamination in which the donor layer and the acceptor layer are deposited alternately.

Figure 2:
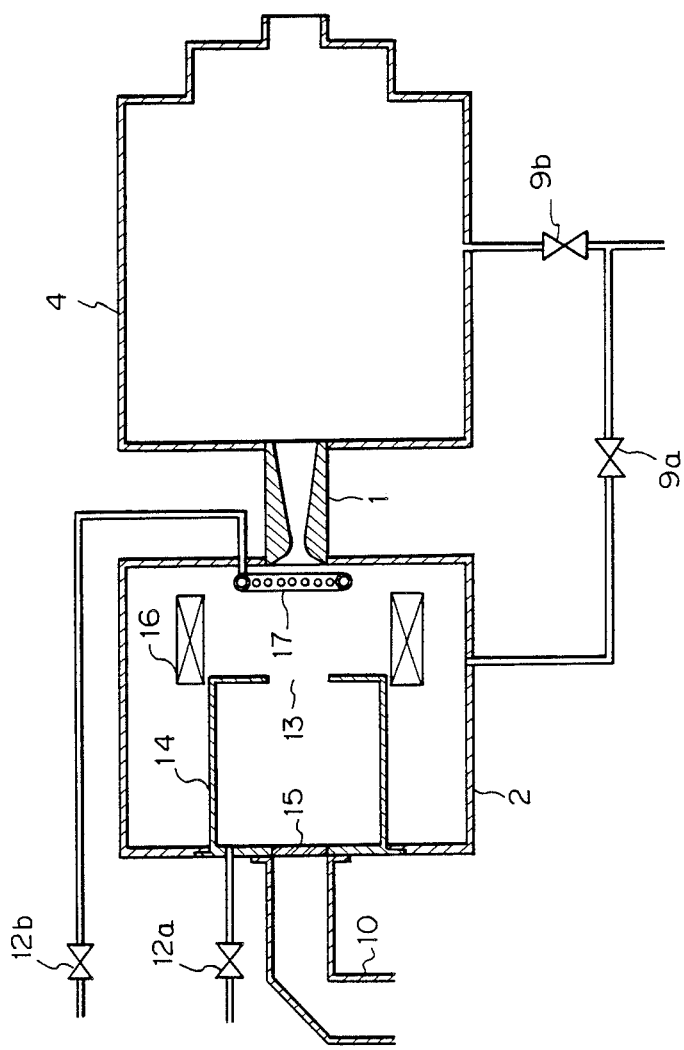
FIG. 2 is an enlarged view of the portions of its upstream chamber and pressure adjusting chamber.

Further, by referring to FIG. 2, the upstream chamber 2 and the pressure-adjusting chamber 4 will be described.

In the upstream chamber 2, a cavity resonator 14 having an opening 13 is provided at the position opposed to the convergent-divergent nozzle 1. On the rear side of the cavity resonator 14, there is provided a microwave introducing window 15 constituted of a material capable of transmitting microwave such as quarts plate, etc., so that the microwave may be introduced through the waveguide 10 connected thereto. Also, from the rear surface of the cavity resonator 14, non-film-forming gas is fed through the feeding valve 12a.

When microwave is introduced while feeding non-film-forming gas, plasma is generated in the cavity resonator 14. The plasma is withdrawn from the opening 13 by a magnet 16 toward the convergent-divergent nozzle 1. The cavity resonator 14 should preferably be one satisfying electron cyclotron resonance condition so that plasma can be generated with high efficiency. The magnet 16 can be omitted.

On the other hand, immediately before the convergent-divergent nozzle 1, a ring-shaped feeding pipe 17 connected to the feeding valve 12b is provided, and film-forming gas is fed through the small holes provided on the feeding pipe 17 so as to be contacted with plasma. On the other hand, the upstream chamber 2 and the pressure-adjusting chamber 4 are evacuated through the pressure control valves 9a, 9b so that the pressure on the upstream chamber 2 side may become higher, and the film-forming gas activated by contact with plasma is directly jetted out from the convergent-divergent nozzle 1.

The convergent-divergent nozzle 1 has its inlet opening 1a opened to the upstream chamber 2 and the outlet opening 1b open to the pressure-adjusting chamber 4.

The convergent-divergent nozzle 1 may be one which is gradually narrowed in opening area from the inlet opening 1a to become a throat portion 1b, and is again gradually enlarged in opening area to become an outlet opening 1c, as described above, but it is preferable that the inside circumferential surface near the outlet opening 1c should be substantially parallel to the center axis as shown enlarged in FIG. 3(a). This is because the direction of gas flow jetted can be made parallel so far as possible with ease, since it is influenced to some extent by the direction of the inside circumferential surface near the outlet opening 1c. However, as shown in FIG. 3(b) by making the angle α of the inside circumferential surface from the throat portion 1b to the outlet opening 1c with respect to the center axis 7° or less, preferably 5° or less, peel-off phenomenon will not easily occur and the flow of the jetted gas is maintained to be substantially uniform. Therefore in this case a parallel portion as mentioned above is not particularly required to be formed. By omitting formation of the parallel portion, manufacture of the convergent-divergent nozzle 1 can be easily done. Also, by making the convergent-divergent nozzle a rectangular shape as shown in FIG. 3(c), the gas can be jetted in the shape of a slit. Also, one having a nozzle with an inversed ratio of longitudinal length to lateral length shown in FIG. 3(c) may be employed, which enables a wide range of film formation.

Here, the above peel-off phenomenon refers to the one which occurs when there is projection, etc., on the inside surface of the convergent-divergent nozzle 1, so that the boundary layer between the inside surface of the convergent-divergent nozzle 1 and the passing fluid becomes larger to make the flow nonuniform, which will more frequently occur at the jet stream of higher velocity. The angle α mentioned above should be preferably made smaller as the inside finishing precision of the convergent-divergent nozzle is inferior for the purpose of prevention of the peel-off phenomenon. The inside surface of the convergent-divergent nozzle should preferably be finished to 3 or more of inverse triangle marks, optimally four or more, representing surface finishing precision as defined by JIS B 0601. Particularly, since the peel-off phenomenon at the divergent portion of the convergent-divergent nozzle 1 will affect greatly the subsequent flow of the non-film-forming gas and ultra-fine particles by determining the above finishing precision primarily at the divergent portion, the convergent-divergent nozzle 1 can be prepared more easily. For prevention of peel-off, phenomenon, the throat portion 1b should be made a smooth curved surface so that the differential coefficient in cross-sectional area change rate may not become infinite.

As the material of the convergent-divergent nozzle 1, metals such as iron, stainless steel and others, or otherwise synthetic resins such as polytetrafluoroethylene, acrylic resins, polyvinyl chloride, polyethylene, polystyrene, polypropylene, etc., ceramic materials, quartz, glass, etc., can be widely used. Selection of the material may be done in view of inertness to the ultra-fine particles to be formed, workability, gas releasability in a reduced pressure system. The inside surface of the convergent-divergent nozzle 1 may be plated or coated with a material on which adhesion or reaction of the ultra-fine particles will hardly occur. A typical example is a coating of polytetrafluoroethylene, etc.

The length of the convergent-divergent nozzle 1 can be chosen as desired depending on the size of the apapratus, etc. Whereas, when passing through the convergent-divergent nozzle 1, the heat energy possessed by the flow will be converted to kinetic energy. Particularly when jetted out at supersonic velocity, the heat energy will become markedly smaller to give supercooled state. When condensing components are contained in the flow, they can be positively condensed by the above cooled state, whereby fine particles can also be formed.

By permitting the flow to pass through the above convergent-divergent nozzle 1 under adequate control of the relationship between the pressure ratio $P/P_0$ of the pressure $P$ in the pressure-adjusting chamber 4 which is on the downstream side to the pressure $P_0$ in the upstream chamber 2 which is on the upstream side and the ratio $A/A^*$ of the cross-sectional area $A$ of the outlet opening $1c$ to the cross-sectioned area $A^*$ of the throat portion $1b$, the flow is formed into a beam, thus flowing at supersonic velocity from the pressure-adjusting chamber 4 to the downstream chamber 5. And, the film-forming components are blown against the substrate 3 as a flow formed into a beam to effect film formation.

Figure 4:
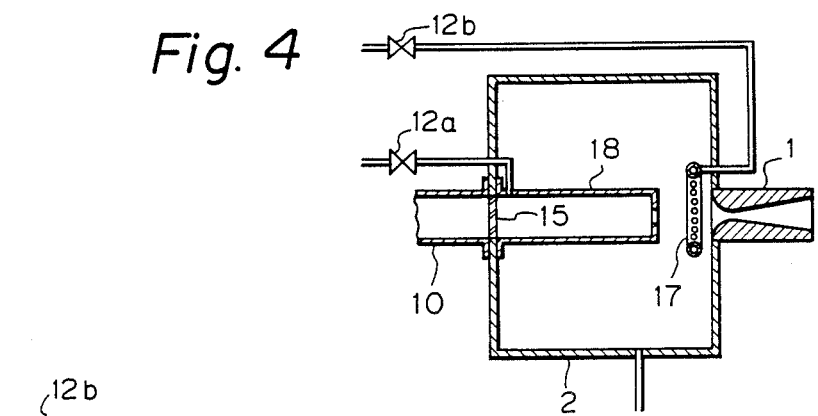
FIGS. 4–6 each illustrates another example of upstream chamber.
Figure 5:
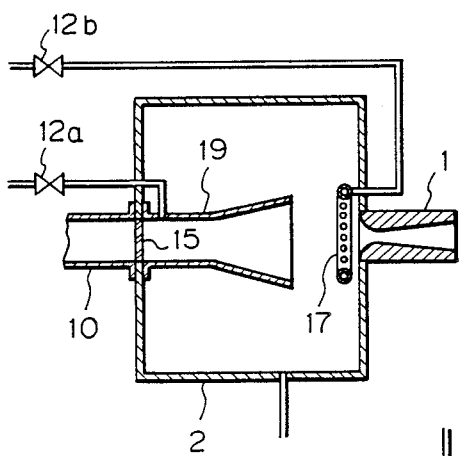

In another embodiment of the invention plasma is generated by a cavity resonator 21. As shown in FIG. 4, a slot antenna 18 may be connected to the waveguide 10 through the microwave introducing window 15. As shown in FIG. 5, a horn antenna 19 may be connected. Also in these cases, a magnet may be provided in the vicinity of the outlet to withdraw the plasma generated efficiently. By introducing microwave through a slot antenna 18 or a horn antenna 19, since the length of these antennas can be freely controlled, the plasma can be readily taken out at a position nearer to the convergent-divergent nozzle 1.

Figure 6:
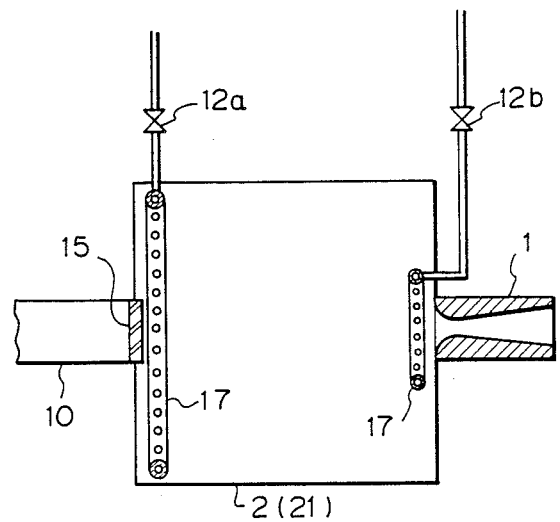

FIG. 6 shows an example in which the upstream chamber 2 itself is designed to be a cavity resonator 21 and equipped directly with the convergent-divergent nozzle 1, which is particularly effective for reaction products with short life and substance necessary for a lamination step. In this case, the film-forming gas and the non-film-forming gas may be also previously mixed and fed through the feeding valve 12a.

In this example, plasma generated by microwave is used for activation of the film-forming gas and the reaction in the upstream chamber 2, but it is also possible to employ plasma by electromagnetic wave other than light, heat, microwave, or radiation containing X-ray, electron beam.

Also, in this example, the substrate 3 is shaped into a band and moved by take-up on and the take-out from the rotatary rollers 6a, 6b, but the substrate can be also shaped into a drum, alternatively shaped in a flat plate and the convergent-divergent nozzles 1 of the upstream chambers 2 may be aligned in the moving direction. Further, the upstream chambers 2 can also comprise two, four a more chambers.

Figure 7:
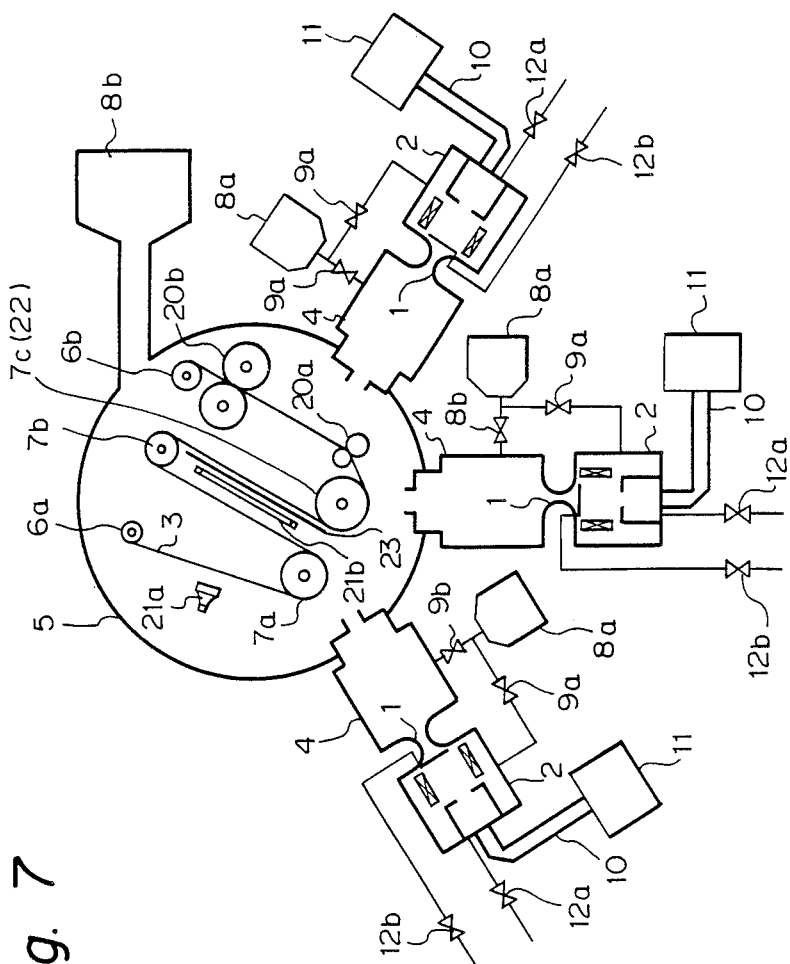
FIGS. 7 and 8 are schematic illustrations showing another example of the present invention.

FIG. 7 is a schematic illustration of another example of the present invention.

The substrate 3 in the downstream chamber 5 is shaped into a band, and, while being delivered out from the rotatary roller 6a, is taken up on the take-up roller 6b by a supporting roller 7a, supporting roller 7b, supporting heating roller 7c, a pair of pressure rollers 20a, and a pair of pressure rollers 20b positioned downstream thereof.

The above convergent-divergent nozzles 1 are aligned in the moving direction of the substrate 3 moving from the rotatory roller 6a to the take-up roller 6b, each being directed toward the substrate 3 moving as guided by the respective rollers. Each roller supports the substrate at the back side against the blowing force of the fine particles by the convergent-divergent nozzle 1, and also serves as a means for imparting external energy such as pressure, heat, light, etc.

Between the rotatory roller 6a and the supporting roller 7a, an IR-rays lamp irradiating IR-ray for heating is provided as an energy imparting means 21a, and between the supporting roller 7a and a supporting roller 7b, a mercury lamp irradiating light with short wavelength is provided as an energy imparting means 21b. Also, the supporting-heating roller 7c heats the substrates when it passes therethrough, and also functions as an energy imparting means 22c. 23 is a shielding plate for preventing irradiation of light from the energy imparting means 21b onto the substrate 3 between the supporting roller 7b and a supporting heating roller 7c.

In the downstream chamber 5, it is also possible to provide a laminate process by feeding a laminate material by utilizing, for example, the pressure rollers 20a, 20b.

Figure 8:
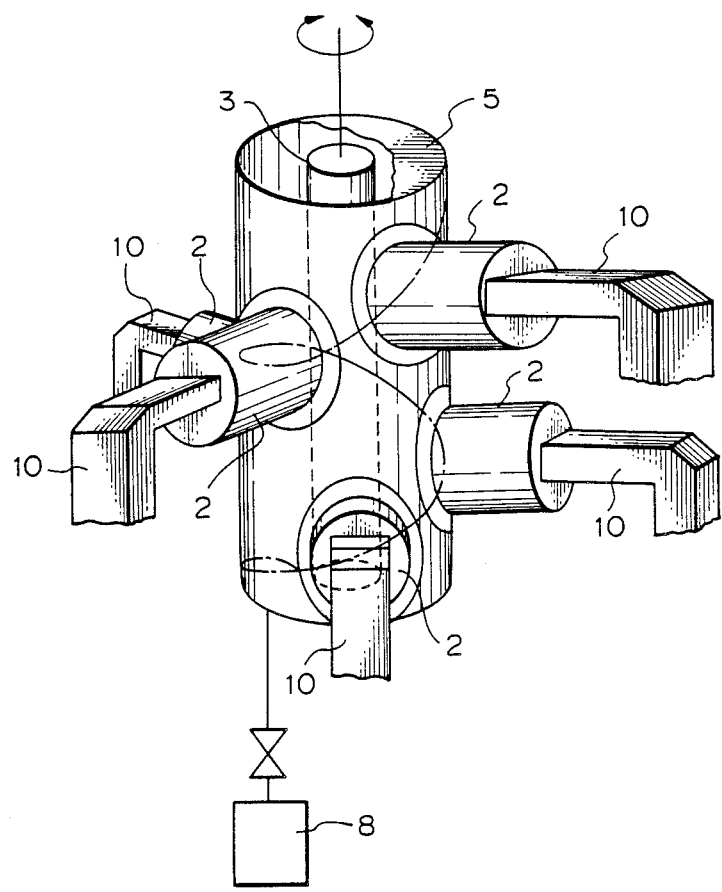

FIG. 8 is a schematic illustration showing still another example of the present invention.

The downstream chamber 5 is cylindrically shaped and three upstream chambers 2 having convergent-divergent nozzles 1 are connected thereto at its circumference. The respective convergent-divergent nozzles 1 are directed toward the substrate 3 in the downstream chamber 5, respectively, communicating the upstream chamber 2 to the downstream chamber 5.

The substrate 3 in the downstream chamber 5 is in a shape of cylindrical drum and is rotatable. The upstream chambers 2 are disposed along an imagined helical curve around the downstream chamber 5 as shown in the chain line in the Figure, with the adjacent upstream chamber 2 being positioned so as to be shifted longitudinally and laterally toward the rotational moving direction of the substrate 3.

Thus, by designing a lot of upstream chambers 2 to be located with the adjacent upstream chambers so as to be shifted longitudinally and laterally toward the moving direction of the substrate 3, even with a limited blowing area formed into a beam, blowing to a large area as a whole is rendered possible by collecting much of such limited area.

Also, in this example, the substrate 3 is in a shape of a rotatable drum, around which the upstream chambers 2 are disposed along an imagined helical curve. It is also possible to shape the substrate 3 in a planer form and to dispose the upstream chambers 2 in zig-zag or staggered arrangement on the wall of the downstream chamber. In this case, the substrate 3 moves rectilinearly chamber. In this case, the substrate 3 moves rectilinearly along a horizontal plane.

As the substrate to be used in the present invention, any desired shape such as belt, plate, cylinder, etc., can be selected depending on the use. As the material for the substrate, there may be employed a metal, a polymer, a paper, etc., specifically aluminum, polyethylene terephthalate, polyimide, polyamide, polycarbonate, polyacetate, polymethyl methacrylate, etc.

As described above, according to the present invention it becomes possible to effect blowing fine particles uniformly against a substrate 3 of large area with good efficiency.

Also, deposited films of good quality can be produced in a large amount, since deposited film formation of different materials can be performed efficiently and yet by means of one device.

As the metals, preferable are aluminum, nickel, bronze, stainless steel, molybdenum and the like. Any polymers which can form a flexible film are suitable for the polymer. More preferable polymers are those which can form a heat-resistant and flexible film. The preferable polymers include polyethylene polyimides, polyamides, polycarbonate, polyacetate, polymethyl methacrylate and the like. Further onto the above-mentioned, film a light-transmissive electro-conductive film may be deposited. The electro-conductive film may be formed by any of vapor depositing method, sputtering method, and coating method.

Thus, the present invention is expected to be utilized for bulk production of electrophotographic photosensitive drums, magnetic recording tapes, magneto-optical recording tapes, etc.

We claim:

1. A device for blowing fine particles onto a substrate, the device comprising:
   a plurality of means for producing a beam of a flow of fine particles, wherein each said beam producing means is provided with an upstream chamber for dispersing the fine particles in a carrier gas, with said upstream chamber communicating with a pressure-adjusting chamber through a nozzle for jetting out the dispersed fine particles as a beam to a downstream side;
   energy imparting means for imparting energy to the substrate, wherein
   said beam producing means communicates through each of said pressure-adjusting chambers with a downstream chamber provided therein with a movable substrate, and said plurality of beams produced by said beam producing means being arranged such that each of a plurality of the beams produced by said beam producing means is projected on different portions on the substrate along the moving direction of the substrate, with said plurality of beam producing means being disposed in different longitudinal and lateral directions from each other with respect to the substrate.

2. A device according to claim 1, wherein said nozzle is a convergent-divergent nozzle.

3. A device according to claim 1, wherein said substrate comprises a metal or a polymer.

4. A device according to claim 3, wherein said metal is selected from the group consisting of aluminum, nickel, bronze, stainless steel, and molybdenum.

5. A device according to claim 3, wherein said polymer is capable of forming a heat-resistant and flexible film.

6. A device according to claim 3, wherein said polymer is selected from the group consisting of polyethylene terephthalate, polyimides, polyamides, polycarbonate, polyacetate, and polymethyl methacrylate.

7. A device for blowing fine particles onto a substrate, the device comprising:
   a plurality of means for producing a beam of a flow of fine particles, wherein each said beam producing means is provided with an upstream chamber for dispersing the fine particles in carrier gas, with said upstream chamber communicating with a pressure-adjusting chamber through a nozzle for jetting out the dispersed fine particles as a beam to a downstream side;
   gas exciting means provided in each said upstream chamber for exciting the fine particles;
   energy imparting means for imparting energy to the substrate, wherein
   said beam producing means communicates through each of said pressure-adjusting chambers with a downstream chamber provided therein with a movable substrate, and the plurality of beams provided by said beam producing means being arranged such that each of a plurality of the beams produced by said beam producing means is projected to different portions on the substrate along the moving direction of the substrate, with said plurality of beam producing means being disposed in different longitudinal and lateral directions from each other with respect to the substrate.

8. A device according to claim 7, wherein said gas exciting means uses microwave discharging to excite the fine particles.

9. A device according to claim 7, wherein said energy imparting means is a means for heating, pressurization or light irradiation.

10. A device according to claim 7, wherein said substrate comprises a metal or a polymer.

11. A device according to claim 10, wherein said metal is selected from the group consisting of aluminum, nickel, bronze, stainless steel, and molybdenum.

12. A device according to claim 10, wherein said polymer is capable of forming a heat-resistant and flexible film.

13. A device according to claim 10, wherein said polymer is selected from the group consisting of polyethylene terephthalate, polyimides, polyamides, polycarbonate, polyacetate, and polymethyl methacrylate.

14. A device for blowing fine particles onto a substrate, the device comprising:
   a plurality of means for producing a beam of a flow of fine particles, wherein each said beam producing means is provided with an upstream chamber for dispersing the fine particles in a carrier gas, with said upstream chamber communicating with a pressure-adjusting chamber through a nozzle for jetting out the dispersed fine particles as a beam to a downstream side, wherein
   said beam producing means communicates through each of said pressure-adjusting chambers with a downstream chamber provided therein with a movable substrate, and the plurality of beams produced by said beam producing means being arranged in a manner that each of a plurality of the beams produced by said beam producing means is projected to different portions on the substrate along the moving direction of the substrate, with said plurality of beam producing means being disposed in different longitudinal and lateral directions from each other with respect to the substrate.

15. A device according to claim 14, wherein the substrate is a drum.

16. An apparatus according to claim 7, wherein said nozzle is a convergent-divergent nozzle.

17. A device according to claim 14, wherein said nozzle is a convergent-divergent nozzle.

18. A device according to claim 14, wherein the substrate comprises a metal or a polymer.

19. A device according to claim 18, wherein said metal is selected from the group consisting of aluminum, nickel, bronze, stainless steel, and molybdenum.

20. A device according to claim 18, wherein said polymer is capable of forming a flexible film.

21. A device according to claim 18, wherein said polymer is selected from the group consisting of polyethylene terephthalate, polyimides, polyamides, polycarbonate, polyacetate, and polymethyl methacrylate.

22. A device for blowing fine particles onto a substrate, the device comprising:
- a plurality of means for producing a beam of a flow of fine particles, wherein each said beam producing means is provided with an upstream chamber for dispersing the fine particles in a carrier gas, with said upstream chamber communicating with a pressure-adjusting chamber through a nozzle for jetting out the dispersed fine particles as a beam to a downstream side;
- gas exciting means provided in each said upstream chamber for exciting the fine particles, wherein
- said beam producing means communicates through each of said pressure-adjusting chambers with a downstream chamber provided therein with a movable substrate and the plurality of beams produced by said beam producing means being arranged in a manner that each of a plurality of the beams produced by said beam producing means is projected to different portions on the substrate along the moving direction of the substrate, with said plurality of beam producing means being in different longitudinal and lateral directions from each other with respect to the substrate.

23. A device according to claim 20, wherein the substrate is a drum.

24. A device according to claim 22, wherein said nozzle is a convergent-divergent nozzle.

25. A device according to claim 22, wherein said gas exciting means uses microwave discharging to excite the fine particles.

26. A device according to claim 22, wherein said substrate comprises a metal or a polymer.

27. A device according to claim 26, wherein said metal is selected from the group consisting of aluminum, nickel, bronze, stainless steel, and molybdenum.

28. A device according to claim 26, wherein said polymer is capable of forming a heat-resistant and flexible film.

29. A device according to claim 26, wherein said polymer is selected from the group consisting of polyethylene terephthalate, polyimides, polyamides, polycarbonate, polyacetate, and polymethyl methacrylate.

30. A film forming apparatus for forming a film on a substrate, said apparatus comprising:
- a plurality of means for producing a beam of a flow of fine particles, wherein each said beam producing means is provided with an upstream chamber for dispersing the fine particles in a carrier gas, with said upstream chamber communicating with a pressure-adjusting chamber through a nozzle for jetting out the dispersed fine particles as a beam to a downstream side;
- energy imparting means for imparting energy to the substrate, wherein
- said beam producing means communicates through each of said pressure-adjusting chambers with a downstream chamber provided therein with a movable substrate, and said plurality of beams produced by said beam producing means being arranged such that each of a plurality of the beams produced by said beam producing means is projected on different portions on the substrate along the moving direction of the substrate, with said plurality of beam producing means being disposed in different longitudinal and lateral directions from each other with respect to the substrate.

31. An apparatus according to claim 30, wherein said nozzle is a convergent-divergent nozzle.

32. An apparatus according to claim 30, wherein said substrate comprises a metal or a polymer.

33. An apparatus according to claim 32, wherein said metal is selected from the group consisting of aluminum, nickel bronze, stainless steel, and molybdenum.

34. An apparatus according to claim 32, wherein said polymer is capable of forming a heat-resilient and flexible film.

35. An apparatus according to claim 32, wherein said polymer is selected from the group consisting of polyethylene terephthalate, polyimides, polyamides, polycarbonate, polyacetate, and polymethyl methacrylate.

36. A film-forming apparatus for forming a film on a substrate, said apparatus comprising:
- a plurality of means for producing a beam of a flow of fine particles, wherein each of said beam producing means is provided with an upstream chamber for dispersing the fine particles in a carrier gas, with said upstream chamber communicating with a pressure-adjusting chamber through a nozzle for wetting out the dispersed fine particles as a beam to a downstream side;
- gas exciting means provided in each said upstream chamber for exciting the fine particles;
- energy imparting means for imparting energy to the substrate, wherein
- said beam producing means communicates through each of said pressure-adjusting chambers with a downstream chamber provided therein with a movable substrate, and the plurality of beams produced by said beam producing means being arranged such that each of a plurality of the beams produced by said beam producing means is projected to different portions on the substrate along the moving direction of the substrate, with said plurality of beam producing means being disposed in different longitudinal and lateral directions from each other with respect to the substrate.

37. An apparatus according to claim 36, wherein said nozzle is a convergent-divergent nozzle.

38. An apparatus according to claim 36, wherein said gas exciting means uses microwave discharging to excite the fine particles.

39. An apparatus according to claim 36, wherein said energy imparting means is a means for heating, pressurization or light irradiation.

40. An apparatus according to claim 36, wherein said substrate comprises a metal or a polymer.

41. An apparatus according to claim 40, wherein said metal is selected from the group consisting of aluminum, nickel, bronze, stainless steel, and molybdenum.

42. An apparatus according to claim 40, wherein said polymer is capable of forming a heat-resistant and flexible film.

43. An apparatus according to claim 30, wherein said polymer is selected from the group consisting of polyethylene terephthalate, polyimides, polyamides, polycarbonate, polyacetate, and polymethyl methacrylate.

44. A film-forming apparatus for forming a film on a substrate, said apparatus comprising:

a plurality of means for producing a beam of a flow of fine particles, wherein each said beam producing means is provided with an upstream chamber for dispersing the fine particles in a carrier gas, with said upstream chamber communicating with a pressure-adjusting chamber through a nozzle for jetting out the dispersed fine particles as a beam to a downstream side, wherein said beam producing means communicates through each of said pressure-adjusting chambers with a downstream chamber provided therein with a movable substrate, and the plurality of beams produced by said beam producing means being arranged in a manner that each of a plurality of the beams produced by said beam producing means is projected to different portions on the substrate along the moving direction of the substrate, with said plurality of beam producing means being disposed in different longitudinal and lateral directions from each other with respect to the substrate.

45. An apparatus according to claim 44, wherein said nozzle is a convergent-divergent nozzle.

46. An apparatus according to claim 44, wherein said substrate comprises a metal or a polymer.

47. An apparatus according to claim 46, wherein said metal is selected from the group consisting of aluminum, nickel, bronze, stainless steel, and molybdenum.

48. An apparatus according to claim 46, wherein said polymer is capable of forming a flexible film.

49. An apparatus according to claim 46, wherein said polymer is selected from the group consisting of polyethylene terephthalate, polyimides, polyamides, polycarbonate, polyacetate, and polymethyl methacrylate.

50. An apparatus according to claim 44, wherein the substrate is a drum.

51. A film-forming apparatus for forming a film on a substrate, said substrate comprising:

a plurality of means for producing a beam of a flow of fine particles, wherein each said beam producing means is provided with an upstream chamber for dispersing the fine particles in a carrier gas, with said upstream chamber communicating with a pressure-adjusting chamber through a nozzle for jetting out the dispersed fine particles as a beam to a downstream side;

gas exciting means provided in each said upstream chamber for exciting the fine particles, wherein said beam producing means communicates through each of said pressure-adjusting chambers with a downstream chamber provided therein with a movable substrate and the plurality of beams provided by said beam producing means being arranged in a manner that each of a plurality of the beams produced by said beam producing means is projected to different portions on the substrate along the moving direction of the substrate, with said plurality of beam producing means being in different longitudinal and lateral directions from each other with respect to the substrate.

52. An apparatus according to claim 51, wherein said nozzle is a convergent-divergent nozzle.

53. An apparatus according to claim 51, wherein said gas exciting means uses microwave discharging to excite the fine particles.

54. An apparatus according to claim 51, wherein said substrate comprises a metal or a polymer.

55. An apparatus according to claim 54, wherein said metal is selected from the group consisting of aluminum, nickel, bronze, stainless steel, and molybdenum.

56. An apparatus according to claim 54, wherein said polymer is capable of forming a heat-resistant and flexible film.

57. An apparatus according to claim 54, wherein said polymer is selected from the group consisting of polyethylene terephthalate, polyimides, polyamides, polycarbonate, polyacetate, and polymethyl methacrylate.

58. An apparatus according to claim 51, wherein the substrate is a drum.

* * * * *

UNITED STATES PATENT AND TRADEMARK OFFICE
CERTIFICATE OF CORRECTION

PATENT NO. : 4,957,061
DATED : September 18, 1990
INVENTOR(S) : Kenji Ando, et al.

It is certified that error appears in the above-identified patent and that said Letters Patent is hereby corrected as shown below:

COLUMN 4:

Line 57, "evaculated" should read --evacuated--.

COLUMN 5:

Line 41, "quarts" should read --quartz--.

COLUMN 7:

Line 2, "apa" should read --apparatus--.

Line 3, "pratus" should be deleted.

Line 59, "a" should read --or--.

COLUMN 8:

Line 11, "IR-rays lamp irradiating IR-ray" should read --IR-ray lamp irradiating IR-rays--.

Line 17, "strates" should read --strate--.

Line 57, "cham-" should be deleted.

Line 58, delete entire line.

COLUMN 9:

Line 12, "polyethylene polyimides," should read --polyethylene terephthalate, polyimides,--.

UNITED STATES PATENT AND TRADEMARK OFFICE
CERTIFICATE OF CORRECTION

PATENT NO. : 4,957,061
DATED : September 18, 1990
INVENTOR(S) : Kenji Ando, et al.

It is certified that error appears in the above-identified patent and that said Letters Patent is hereby corrected as shown below:

COLUMN 10:

Line 12, "vided" should read --duced--.

COLUMN 11:

Line 34, "claim 20," should read --claim 22,--.

COLUMN 12:

Line 15, "nickel bronze," should read --nickel, bronze--.

Line 17, "heat-resilient" should read --heat-resistant--.

Line 26, "of" should be deleted.

Line 30, "wet-" should read --jet--.

Line 65, "claim 30," should read --claim 40,--.

Signed and Sealed this

Twelfth Day of May, 1992

Attest:

DOUGLAS B. COMER

Attesting Officer     Acting Commissioner of Patents and Trademarks